US006724622B2

United States Patent
Liao

(10) Patent No.: US 6,724,622 B2
(45) Date of Patent: Apr. 20, 2004

(54) COMPUTER WITH A REMOVABLE ADD-ON CARD FIXING MECHANISM

(75) Inventor: Yuan-Kun Liao, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 120 days.

(21) Appl. No.: 10/063,302

(22) Filed: Apr. 10, 2002

(65) Prior Publication Data

US 2003/0123221 A1 Jul. 3, 2003

(30) Foreign Application Priority Data

Dec. 28, 2001 (TW) ...................................... 90132991 A

(51) Int. Cl.[7] .............................................. G06F 1/16
(52) U.S. Cl. ....................... 361/686; 361/684; 439/152; 439/155; 439/157; 439/160
(58) Field of Search ............................. 361/683, 684, 361/686; 439/64, 152, 153, 155, 157, 159, 160, 172; 360/99.06

(56) References Cited

U.S. PATENT DOCUMENTS 5,299,089 A * 3/1994 Lwee ........................ 361/684
5,324,204 A * 6/1994 Lwee ......................... 439/64
5,544,006 A * 8/1996 Radloff et al. .............. 361/683
5,740,012 A * 4/1998 Choi .......................... 361/686
5,889,649 A * 3/1999 Nabetani et al. ............ 361/684

FOREIGN PATENT DOCUMENTS

TW              369213         9/1999

* cited by examiner

Primary Examiner—Darren Schuberg
Assistant Examiner—Anthony Q. Edwards
(74) Attorney, Agent, or Firm—Winston Hsu

(57) ABSTRACT

The computer includes a chassis, a motherboard, and an add-on card fixing mechanism. The motherboard is fastened to the chassis. The add-on card fixing mechanism is attached, yet removable from, the motherboard by first and second couplers located on the motherboard and add-on card fixing mechanism respectively. Add-on cards can be installed into the add-on card fixing mechanism. The add-on card fixing mechanism can then be attached to the motherboard. The add-on card fixing mechanism can then be actuated in such a way as to electrically and mechanically connect the add-on cards to the motherboard. Finally, the add-on card fixing mechanism can be actuated to remove the add-on cards and allow removal of the add-on card fixing mechanism from the motherboard.

14 Claims, 9 Drawing Sheets

COMPUTER WITH A REMOVABLE ADD-ON CARD FIXING MECHANISM

BACKGROUND OF INVENTION

1. Field of the Invention

The present invention relates to a computer, and more particularly, to a computer with a removable add-on card fixing mechanism.

2. Description of the Prior Art

Computers are indispensable electronic products in modern life and are very popular with consumers. In order to make computers more useful and fulfill the various requirements of consumers, manufacturers have developed many different kinds of function-adding add-on cards. These add-on cards electrically connect to a computer through standardized slots on the computer motherboard and extend the function and capability of the computer. As new technologies are developed day-by-day and the requirements of consumers increase just as rapidly, computers are becoming lighter, thinner, and smaller. This means that computer designers and users must install more and more add-on cards into smaller computers. Add-on cards come in many different standards and sizes. If these add-on cards are installed vertically inside the computer, perpendicular to the motherboard, the size of the computer will be larger than if the add-on cards are installed in a horizontal manner, parallel to the motherboard. So to minimize the overall size and bulkiness of the computer many designers choose to do the latter.

Please refer to FIG. 1. FIG. 1 is a perspective view of a prior art computer 10. The computer 10 comprises a chassis 12, a motherboard 14, a processor 16, a power supply 18, and a riser card 20. The motherboard 14 is fixed on the chassis 12. The processor 16 is fixed on the motherboard 14 for controlling the operations of the computer 10. The power supply 18 is fixed on the chassis 12 for providing electrical power to the computer 10. The riser card 20 is vertically installed on and electrically connected to the motherboard 14. The riser card 20 comprises at least a slot 24 for receiving an add-on card 22 so that the add-on card 22 can electrically connect to the motherboard 14 through the riser card 20. The add-on card 22 is a network card, a video card, a RAID card, or any other type of function-adding card.

In order to accommodate flat shaped computer cases, the computer 10 shown in FIG. 1 uses the riser card 20 as an interface between the motherboard 14 and the add-on card 22. The add-on card 22 is horizontally inserted into the slot 24 of the riser card 20 so that the add-on card 22 can electrically connect to the motherboard 14 through the riser card 20. Although this assembly method can decrease the overall height of the computer 10, it is inconvenient for operating staff or users to assemble. The computer 10 further comprises other electronic components installed on the motherboard 14. Operating staff or users must exert a horizontal force directly on to the add-on card 22 each time it is inserted into or removed from the slot 24 of the riser card 20. As it is easy to accidentally touch the electronic components on the motherboard 14 or on the add-on card 22 when inserting or removing the add-on card 22 electronic components are easily damaged.

SUMMARY OF INVENTION

It is therefore a primary objective of the claimed invention to provide a computer with a removable add-on card fixing mechanism, so as to solve the above mentioned problems.

The claimed invention, briefly summarized, discloses a computer. The computer comprises a chassis, a motherboard, at least a first coupler, and a fixing mechanism. The motherboard fixed on the chassis has a connecting port installed at one side of the motherboard along a first direction. The first coupler is formed on the chassis. The fixing mechanism comprises a housing, a first slot, at least a second slot, an active shaft and at least a second coupler. The housing is disposed along the first direction. The first slot is installed at a first side of the housing along the first direction and detachably connected to the connecting port. The second slot is installed at the first side of the housing along the first direction. The second slot is electrically connected to the first slot for electrically connecting an add-on card with the fixing mechanism. The active shaft is installed at a second side of the housing along the first direction. The active shaft has at least one supporting rod fixed at one end of the active shaft. The supporting rod is pivot connected to the housing so that the active shaft and the supporting rod can rotate about a rotation axis parallel to the first direction. The second coupler is formed at a bottom end of the supporting rod corresponding to a position of the first coupler for engaging with the first coupler.

It is an advantage of the claimed invention that the claimed invention computer comprises a detachable fixing mechanism. When users want to add an add-on card into the computer, users can first insert the add-on card into the second slot or the third slot on the riser card of the fixing mechanism. Users then attach the fixing mechanism to the computer chassis and rotate the active shaft about a rotation axis so as to move the fixing mechanism forward to connect the first slot with the connecting port. The claimed invention computer can be used to easily add an add-on card inside the computer. The assembly process is simple and time saving. Users do not need to exert force on the add-on card directly. The electronic components on the add-on card or on the motherboard are not touched when adding or detaching an add-on card and, therefore, the electronic components are not damaged.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
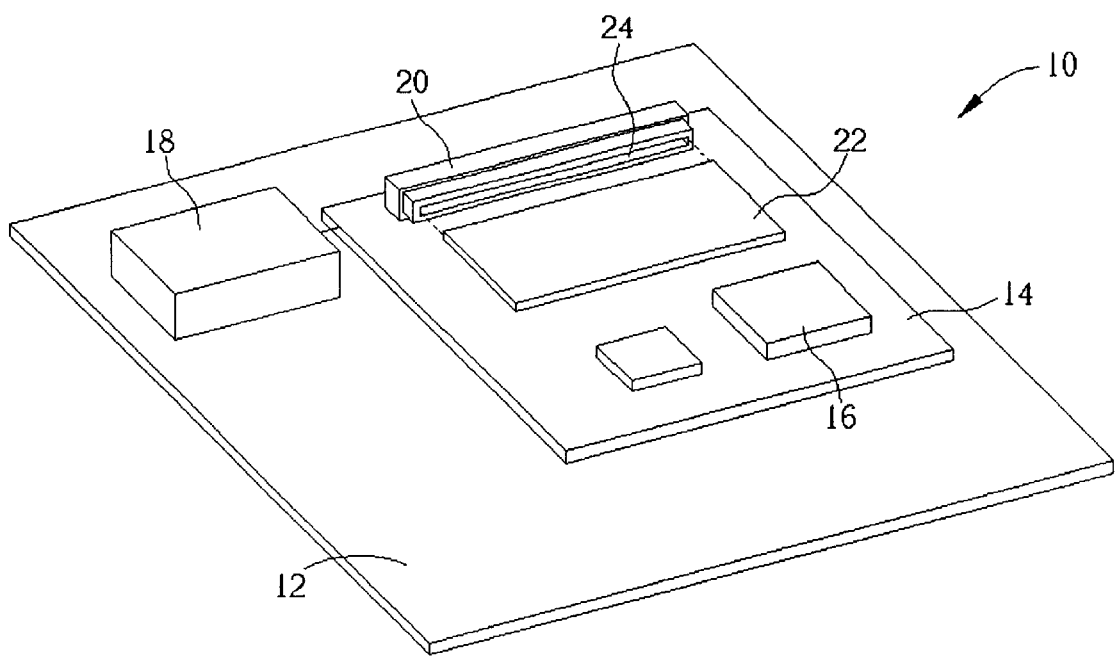
FIG. 1 is a perspective view of a prior art computer.
Figure 2:
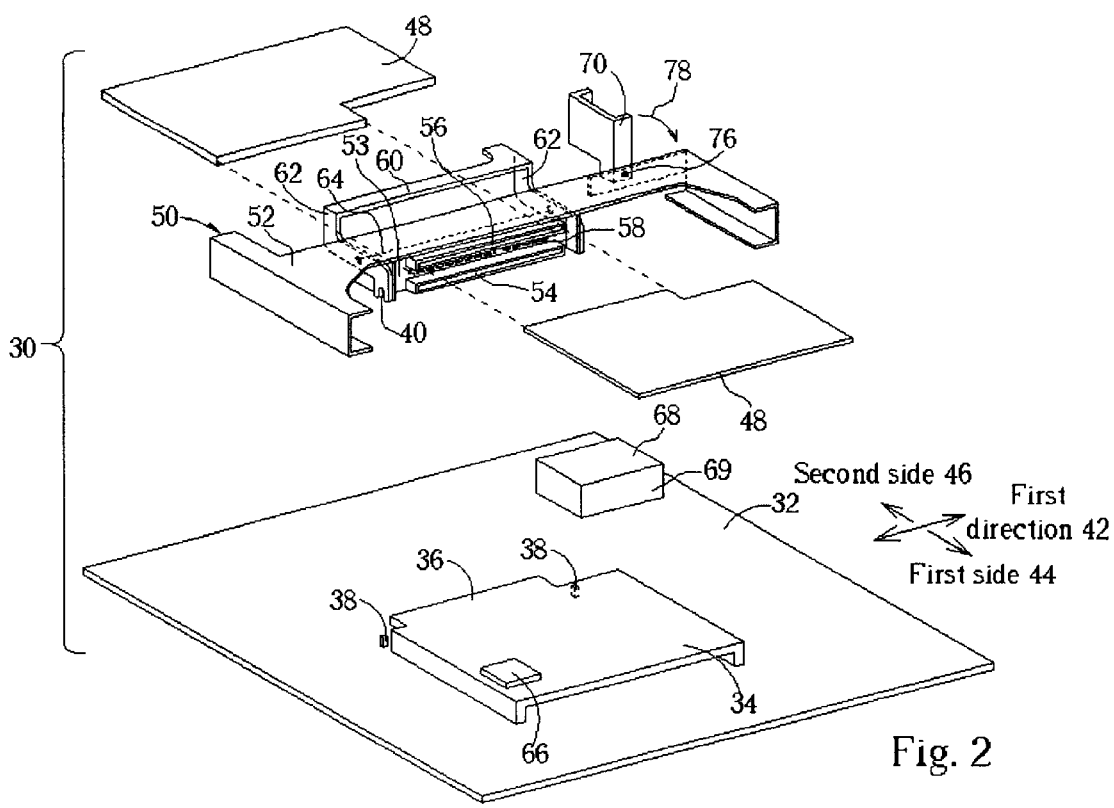
FIG. 2 is a perspective view of a present invention computer.
Figure 3:
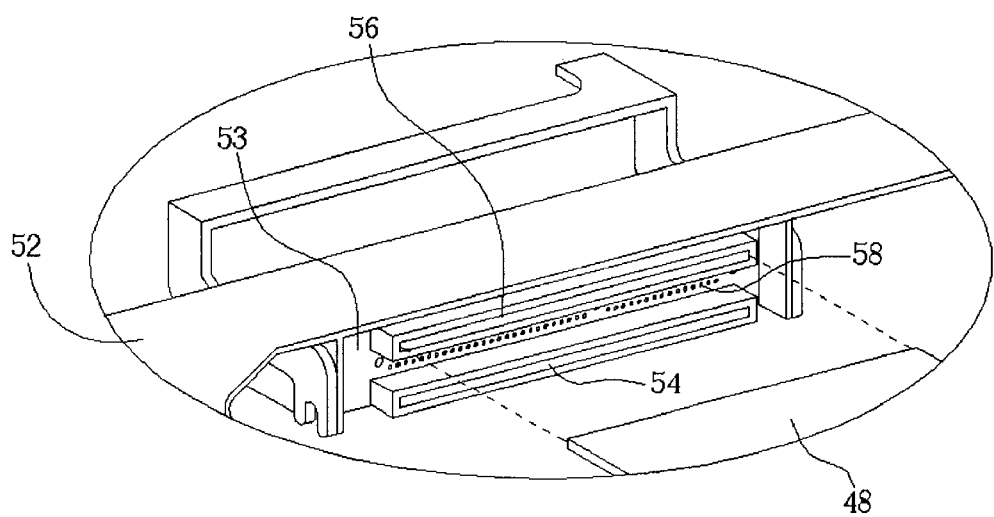
FIG. 3 is an enlarged diagram (looking in a second side direction) of a first slot, a second slot and a third slot shown in FIG. 2.
Figure 4:
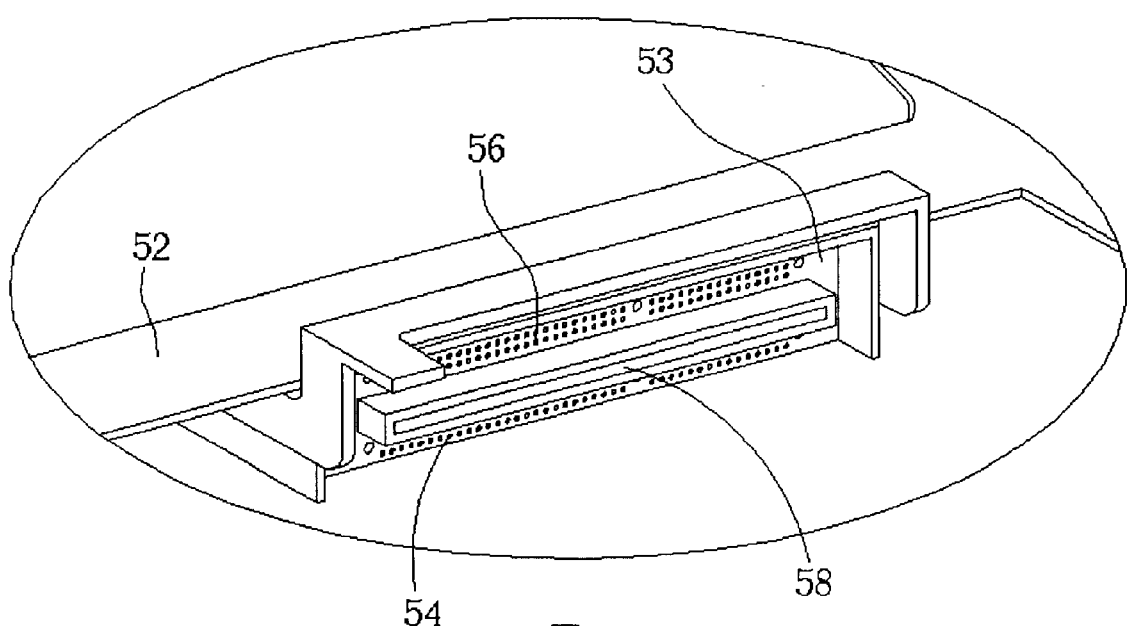
FIG. 4 is an enlarged diagram (looking in a first side direction) of the first slot, the second slot and the third slot shown in FIG. 2.

Please refer to FIG. 2, FIG. 3 and FIG. 4. FIG. 2 is a perspective view of a present invention computer 30. FIG. 3 is an enlarged diagram (looking in a second side 46 direction) of a first slot 54, a second slot 56 and a third slot 58 shown in FIG. 2. FIG. 4 is an enlarged diagram (looking in a first side 44 direction) of the first slot 54, the second slot 56 and the third slot 58 shown in FIG. 2. The computer 30 comprises a chassis 32, a motherboard 34, and a fixing mechanism 50. The motherboard 34 fixed on the chassis 32 has a connecting port 36 installed at one side of the motherboard 34 along a first direction 42. Two first couplers 38 are formed on the chassis 32. The computer 30 further comprises a processor 66 and a power supply 68. The processor 66 is installed on the motherboard 34 for controlling the operations of the computer 30. The power supply 68 is installed on the chassis 32 at the second side 46 of the housing 52 for providing electrical power to the computer 30.

The fixing mechanism 50 of the present invention is detachable and is installed on the chassis 32. The fixing mechanism 50 comprises a housing 52, a riser card 53, a first slot 54, a second slot 56, a third slot 58, and an active shaft 60. The active shaft 60 has two supporting rods 62 fixed at two ends of the active shaft 60. The housing 52 is disposed on the chassis 32 along the first direction 42. The riser card 53 is fixed under the housing 52 along the first direction 42. The first slot 54 is installed at the first side 44 of the riser card 53 along the first direction 42, and detachably connected to the connecting port 36 of the motherboard 34. The second slot 56 and the third slot 58 are respectively installed at the first side 44 and the second side 46 of the riser card 53 along the first direction 42. The second slot 56 and the third slot 58 are respectively connected to the first slot 54 for receiving the add-on card 48 so that the add-on card can electrically connect to the motherboard 34 through the first slot 54. The add-on card 48 can be a network card, a video card, a RAID card, or any other type of add-on card. The active shaft 60 is installed at the second side 46 of the housing 52 along the first direction 42. The supporting rods 62 are pivot connected to the housing 52 so that the active shaft 60 and the supporting rods 62 can rotate about a rotation axis 64 parallel to the first direction 42. The second couplers 40 are formed at the bottom ends of the supporting rods 62 corresponding to positions of the first couplers 38 for engaging with the first couplers 38. The housing 52 further comprises a lock 70 pivot connected to the second side 46 of the housing 52. The lock 70 can rotate about a rotation axis 76 along an arrow direction 78.

Figure 5:
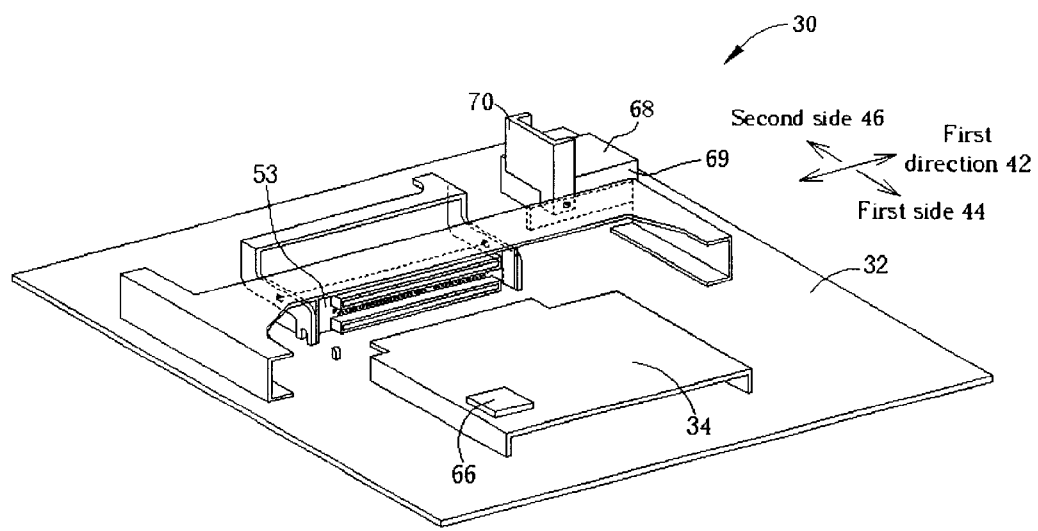
FIG. 5 is a perspective view of the present invention computer in which the fixing mechanism shown in FIG. 2 is disposed on the chassis.
Figure 6:
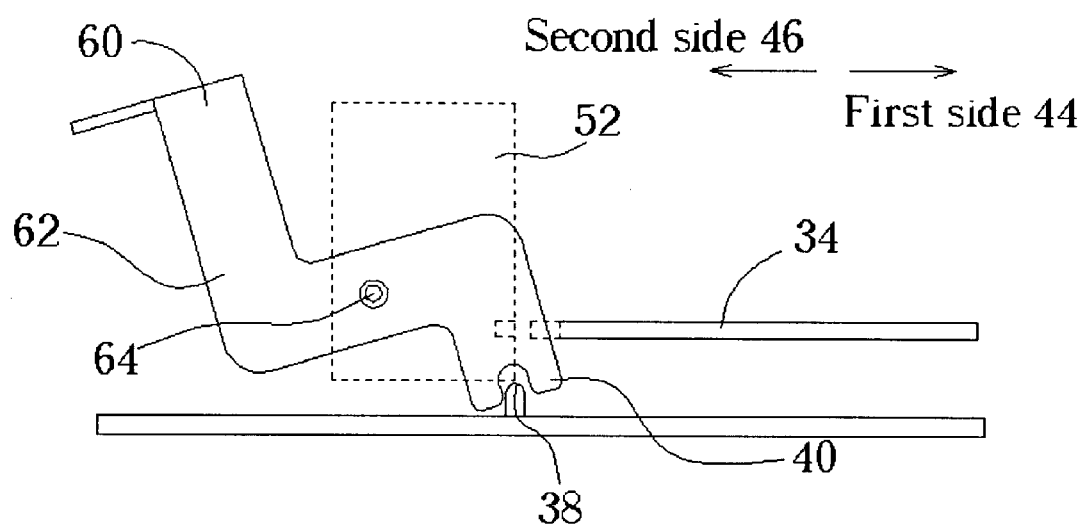
FIG. 6 is a side view (looking in the first direction) of the fixing mechanism and the motherboard in which the second couplers are engaged with the first couplers.
Figure 7:
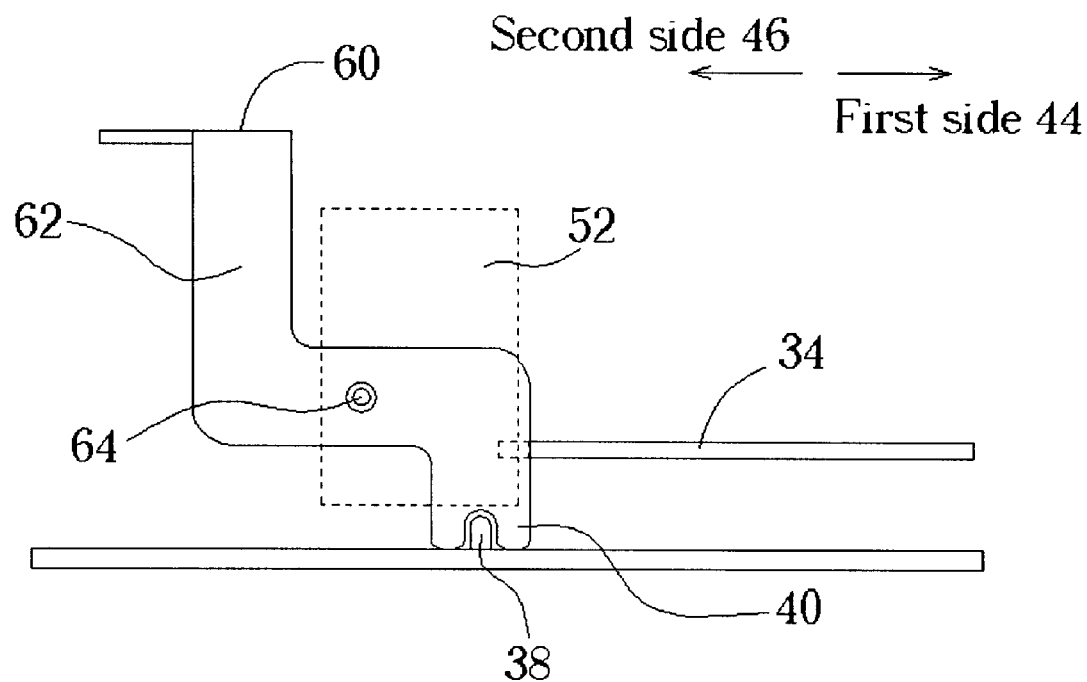
FIG. 7 is a side view (looking in the first direction) of the fixing mechanism and the motherboard in which the first slot of the fixing mechanism is connected onto the motherboard.

Please refer to FIG. 5 to FIG. 7 along with FIG. 2. FIG. 5 is a perspective view of the present invention computer 30 in which the fixing mechanism 50 shown in FIG. 2 is disposed on the chassis 32. FIG. 6 is a side view (looking in the first direction 42) of the fixing mechanism 50 and the motherboard 34 in which the second couplers 40 are engaged with the first couplers 38. FIG. 7 is a side view (looking in the first direction 42) of the fixing mechanism 50 and the motherboard 34 in which the first slot 54 of the fixing mechanism 50 is inserted onto the motherboard 34. When users want to add an add-on card 48 to the computer 30, users can first insert the add-on card 48 into the second slot 56 or the third slot 58 on the riser card 53 of the fixing mechanism 50. Users then connect the first slot 54 on the riser card 53 of the fixing mechanism 50 to the connecting port 36 of the motherboard 34. When users want to attach the first slot 54 on the riser card 53 of the fixing mechanism 50 to the motherboard 34, users can first dispose the fixing mechanism 50 on the chassis 32 so as to make the second couplers 40 engage with the first couplers 38, as shown in FIG. 6. Users then rotate the active shaft 60 about the rotation axis 64 so as to move the fixing mechanism 50 along the first side 44 direction to connect the first slot 54 on the riser card 53 with the connecting port 36 of the motherboard 34, as shown in FIG. 7. Therefore, the add-on card 48 inserted into the second slot 56 or the third slot 58 on the riser card 53 can electrically connect to the motherboard 34 through the first slot 54 on the riser card 53. When users want to detach the fixing mechanism 50 from the motherboard 34, users can rotate the active shaft 60 about the rotation axis 64 so as to move the fixing mechanism 50 along the second side 46 direction to separate the first slot 54 from the connecting port 36. Users can then remove the fixing mechanism 50 from the computer 30 to add or exchange different add-on cards 48.

Figure 8:
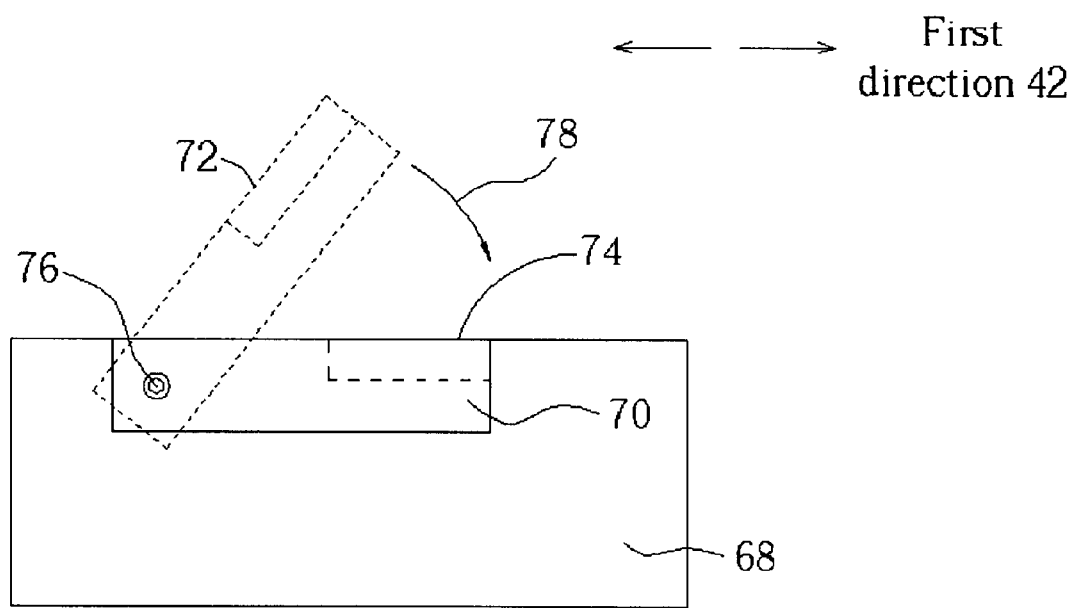
FIG. 8 is a side view (looking in the second side direction) of the lock and the power supply in which the lock is shown rotating from an unlocked position to a locked position.
Figure 9:
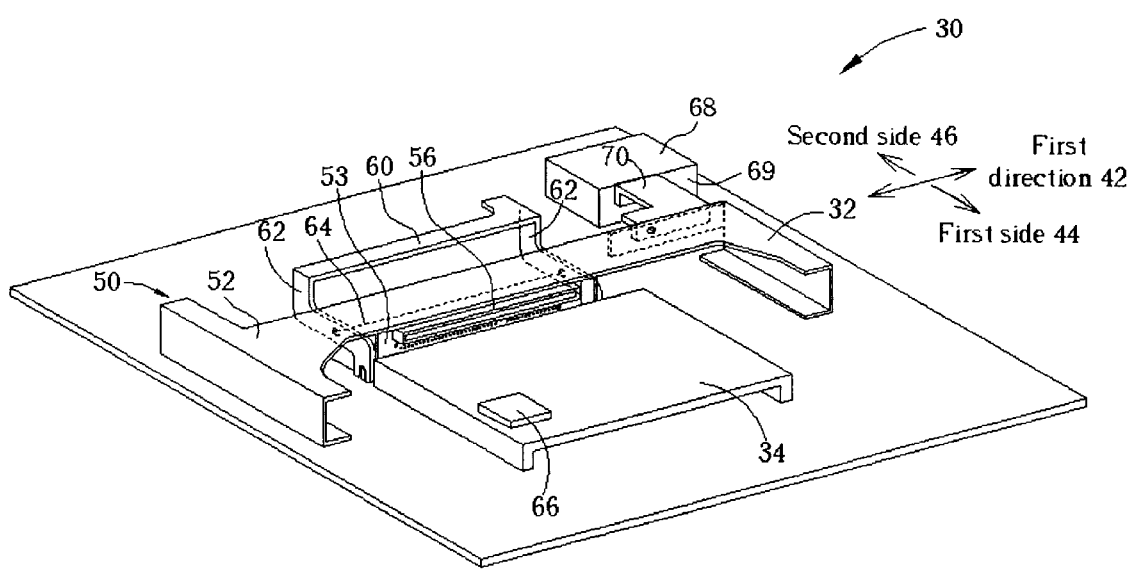
FIG. 9 is a perspective view of the present invention computer in which the fixing mechanism is fixed on the computer.

Please refer to FIG. 8 and FIG. 9. FIG. 8 is a side view (looking in the second side 46 direction) of the lock 70 and the power supply 68 in which the lock 70 rotates about the lock rotation axis 76 from an unlocked position 72 to a locked position 74. FIG. 9 is a perspective view of the present invention computer 30 in which the fixing mechanism 50 is fixed on the computer 30. As shown in FIG. 9, the lock 70 is disposed between the housing 52 and the power supply 68. When the first slot 54 of the fixing mechanism 50 is connected to the connecting port 36, the lock 70 can be rotated to the locked position 74 such that the lock 70 is between the housing 52 and a side wall 69 of the power supply 68 so that the side wall 69 of the power supply 68 can support the fixing mechanism 50 through the lock 70. The lock 70 ensures that the first slot 54 can firmly connect to the connecting port 36, as shown in FIG. 9. Conversely, when users want to remove the fixing mechanism from the motherboard 34, users can rotate the lock 70 to the unlocked position 72 so that the lock 70 is no longer positioned between the housing 52 and the side wall 69 of the power supply 68. Users can then detach the fixing mechanism 50 from the motherboard 34.

The lock 70 of the embodiment mentioned above can be positioned between the housing 52 and the side wall 69 of the power supply 68, however, the present invention is not limited by this. Only if the side wall 69 can support the fixing mechanism 50 through the lock 70 is the side wall 69 to be included in the present invention.

Please continuously refer to FIG. 2 and FIG. 9. In contrast to the prior art computer 10, the present invention computer 30 comprises a detachable fixing mechanism 50. When users want to add an add-on card 48 into the computer 30, users can first insert the add-on card 48 into the second slot 56 or the third slot 58 on the riser card 53 of the fixing mechanism 50. Users then attach the fixing mechanism 50 onto the motherboard 34 by connecting the first slot 54 of the fixing mechanism 50 to the connecting port 36 of the motherboard 34. Finally, the lock 70 is rotated to the locked position 74 ensuring a firm connection between the first slot 54 and the connecting port 36. Conversely, when users want to exchange an add-on card 48, users can first rotate the lock 70 to the unlocked position 72. Users then detach the fixing mechanism 50 from the motherboard 34. Therefore, the present invention computer 30 makes it easier and quicker to add or replace add-on cards 48 inside the computer 30. The assembly process is simple. Users do not need to exert force on the add-on card 48 directly. Electronic components are not touched when attaching or detaching the fixing mechanism 50 onto the motherboard 34 or when utilizing the fixing mechanism 50 and, therefore, the electronic components are not damaged.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A computer comprising:
   a chassis;
   a motherboard fixed on the chassis having a connecting port installed at one side of the motherboard along a first direction;
   at least a first coupler installed on the chassis; and
   a fixing mechanism comprising;
      a housing disposed along the first direction;
      a first slot installed at a first side of the housing along the first direction and detachably connected to the connecting port;
      at least a second slot installed at the first side of the housing along the first direction, the second slot electrically connected to the first slot for electrically connecting an add-on card with the fixing mechanism;
      an active shaft installed at a second side of the housing along the first direction, the active shaft having at least one supporting rod fixed at one end of the active shaft, the supporting rod connected to the housing so that the active shaft and the supporting rod is capable of rotating about a rotation axis parallel to the first direction; and
      at least a second coupler formed at a bottom end of the supporting rod corresponding to a position of the first coupler for engaging with the first coupler.

2. The computer of claim 1 wherein when attaching the fixing mechanism onto the motherboard, the second coupler is engaged with the first coupler, and the active shaft is rotated about the rotation axis so as to move the fixing mechanism forward to connect the first slot with the connecting port; and when detaching the fixing mechanism from the motherboard, the second coupler is engaged with the first coupler, and the active shaft is rotated about the rotation axis so as to move the fixing mechanism backward to separate the first slot from the connecting port.

3. The computer of claim 1 wherein the fixing mechanism further comprises a lock installed at the second side of the housing and capable of being rotated to a locked position and an unlocked position; when the first slot of the fixing mechanism is connected to the connecting port, the lock is capable of being rotated to the locked position to position the lock between the housing and a fixing wall so that the fixing wall is capable of pressuring the fixing mechanism through the lock, creating a firm connection between the first slot and the connecting port; and when dismounting the fixing mechanism, the lock is capable of being rotated to the unlocked position so that the lock is no longer positioned between the housing and the fixing wall, and the first slot is capable of being separated from the connecting port.

4. The computer of claim 3 wherein the fixing wall is a side wall of a power supply mounted on the chassis.

5. The computer of claim 1 wherein the fixing mechanism further comprises at least one third slot installed at the second side of the housing along the first direction for electrically connect an add-on card with the fixing mechanism.

6. The computer of claim 1 further comprising at least one processor installed on the chassis for controlling operations of the computer.

7. The computer of claim 1 wherein the add-on card is a network card, a video card or a RAID card.

8. A fixing mechanism mounted on a computer, the computer comprising a chassis, a motherboard, at least a first coupler and a fixing mechanism, the motherboard being fixed on the chassis having a connecting port installed at one side of the motherboard along a first direction, the first coupler being installed on the chassis, the fixing mechanism comprising;
   a housing disposed along the first direction;
   a first slot installed at a first side of the housing along the first direction and detachably connected to the connecting port;
   at least a second slot installed at the first side of the housing along the first direction, the second slot electrically connected to the first slot for electrically connecting an add-on card with the fixing mechanism;
   an active shaft installed at a second side of the housing along the first direction, the active shaft having at least one supporting rod fixed at one end of the active shaft, the supporting rod connected to the housing so that the active shaft and the supporting rod is capable of rotating about a rotation axis parallel to the first direction; and
   at least a second coupler formed at a bottom end of the supporting rod corresponding to a position of the first coupler for engaging with the first coupler.

9. The fixing mechanism of claim 8 wherein when attaching the fixing mechanism onto the motherboard, the second coupler is engaged with the first coupler, and the active shaft is rotated about the rotation axis so as to move the fixing mechanism forward to connect the first slot with the connecting port; and when detaching the fixing mechanism from the motherboard, the second coupler is engaged with the first coupler, and the active shaft is rotated about the rotation axis so as to move the fixing mechanism backward to separate the first slot from the connecting port.

10. The fixing mechanism of claim 8 further comprising a lock installed at the second side of the housing and capable of being rotated to a locked position and an unlocked position wherein when the first slot of the fixing mechanism is connected to the connecting port, the lock is capable of being rotated to the locked position to position the lock between the housing and a fixing wall so that the fixing wall is capable of pressuring the fixing mechanism through the lock, creating a firm connection between the first slot and the connecting port; and when dismounting the fixing mechanism, the lock is capable of being rotated to the unlocked position so that the lock is no longer positioned between the housing and the fixing wall, and the first slot is capable of being separated from the connecting port.

11. The fixing mechanism of claim 10 wherein the fixing wall is a side wall of a power supply mounted on the chassis.

12. The fixing mechanism of claim 8 further comprising at least one third slot installed at the second side of the housing along the first direction for electrically connect an add-on card with the fixing mechanism.

13. The fixing mechanism of claim 8 wherein the computer further comprises at least one processor installed on the chassis for controlling operations of the computer.

14. The fixing mechanism of claim 8 wherein the add-on card is a network card, a video card or a RAID card.

* * * * *